(12) United States Patent
Gulati et al.

(10) Patent No.: US 10,877,688 B2
(45) Date of Patent: Dec. 29, 2020

(54) SYSTEM FOR MANAGING MEMORY DEVICES

(71) Applicant: Apple Inc., Cupertino, CA (US)

(72) Inventors: Manu Gulati, Saratoga, CA (US); Peter F. Holland, Los Gatos, CA (US); Erik P. Machnicki, Los Altos, CA (US); Robert E. Jeter, Santa Clara, CA (US); Rakesh L. Notani, Sunnyvale, CA (US); Neeraj Parik, San Jose, CA (US); Marc A. Schaub, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 414 days.

(21) Appl. No.: 15/225,343

(22) Filed: Aug. 1, 2016

(65) Prior Publication Data

US 2018/0032281 A1    Feb. 1, 2018

(51) Int. Cl.
*G06F 3/06* (2006.01)
*G11C 11/406* (2006.01)
*G06F 13/16* (2006.01)

(52) U.S. Cl.
CPC .......... *G06F 3/0656* (2013.01); *G06F 3/0604* (2013.01); *G06F 3/0683* (2013.01); *G06F 13/1673* (2013.01); *G11C 11/40615* (2013.01)

(58) Field of Classification Search
None
See application file for complete search history.

(56) References Cited

U.S. PATENT DOCUMENTS 6,848,029 B2   1/2005   Coldewey
7,398,413 B2*  7/2008   Hampel .............. G11C 11/4072
                                                 713/503

(Continued)

FOREIGN PATENT DOCUMENTS

EP    2051170    4/2009
EP    2840506    2/2015

(Continued)

OTHER PUBLICATIONS

International Search Report & Written Opinion in Application No. PCT/US2017/044668 dated Nov. 2, 2017, 14 pages.

(Continued)

*Primary Examiner* — Tracy C. Chan
(74) *Attorney, Agent, or Firm* — Kowert, Hood, Munyon, Rankin & Goetzel, P.C.; Erik A. Heter

(57) ABSTRACT

In some embodiments, a system includes a memory system, a real-time computing device, and a controller. The real-time computing device stores data within a local buffer having a corresponding storage threshold, where the data satisfies the storage threshold, and where the storage threshold is based on a latency of the memory system and an expected rate of utilization of the data of the local buffer. The controller detects that the memory system should perform an operation, where the memory system is unavailable to the real-time computing device during the operation. In response to detecting that an amount of time for the operation exceeds an amount of time corresponding to the storage threshold, the controller overrides the storage threshold. The controller may override the storage threshold by modifying the storage threshold and by overriding a default priority for access requests of the real-time computing device to the memory system.

20 Claims, 7 Drawing Sheets

(56) References Cited

U.S. PATENT DOCUMENTS

| | | | |
|---|---|---|---|
| 7,937,481 B1* | 5/2011 | Sandstrom | G06F 11/004 709/219 |
| 8,176,386 B1* | 5/2012 | Sutardja | G11B 20/18 714/763 |
| 8,402,226 B1* | 3/2013 | Faibish | G06F 12/0804 710/52 |
| 9,170,943 B2 | 10/2015 | Camp et al. | |
| 9,223,662 B2 | 12/2015 | Flynn et al. | |
| 9,910,808 B2* | 3/2018 | Gaither | G06F 13/16 |
| 2012/0102249 A1* | 4/2012 | Duroiu | G06F 13/362 710/110 |
| 2014/0032947 A1* | 1/2014 | Ahmad | G06F 1/3275 713/320 |
| 2014/0089573 A1* | 3/2014 | Sakthikumar | G06F 13/1689 711/105 |
| 2014/0189263 A1 | 7/2014 | Shaharabany et al. | |
| 2015/0039790 A1* | 2/2015 | Bonen | G06F 3/0653 710/57 |
| 2017/0345483 A1* | 11/2017 | Wang | G06F 3/0619 |
| 2018/0181334 A1* | 6/2018 | Radjai | G06F 3/0634 |

FOREIGN PATENT DOCUMENTS

| | | | | |
|---|---|---|---|---|
| EP | 2840506 A2 * | 2/2015 | | G06F 3/0653 |
| WO | 2005/006195 | 1/2005 | | |
| WO | WO-2005006195 A2 * | 1/2005 | | G06F 13/1605 |
| WO | 2016/081000 | 5/2016 | | |
| WO | WO-2016081000 A1 * | 5/2016 | | H04L 12/66 |

OTHER PUBLICATIONS

International Preliminary Report on Patentability in Appl. No. PCT/US2017/044668 dated Feb. 5, 2019, 8 pages.

* cited by examiner

SYSTEM FOR MANAGING MEMORY DEVICES

BACKGROUND

Technical Field

This disclosure relates generally to a system for managing memory devices.

Description of the Related Art

Correct operation of some computer systems is predicated on performance of certain actions by computing devices within certain time constraints. If the constraints are violated, in some cases, unwanted system behavior may occur. Often, these actions may utilize communications between the computing devices and a memory device to retrieve data, store data, or both. However, various operations may make the memory device unavailable to the computing devices. When the memory device is unavailable, in some cases, the computing devices may be unable to perform the actions within the time constraints.

One way to reduce a chance that the constraints are violated is to ensure that the memory device is never unavailable for an amount of time such that the computing devices are unable to perform the actions within the time constraints. However, such a policy may undesirably limit actions that can be performed using the memory device. In some cases, such a policy may prevent certain actions (e.g., device calibrations) from being performed at the memory device.

SUMMARY

In various embodiments, a system for managing memory devices is disclosed where a real-time computing device retrieves data from the memory system to be consumed by the real-time computing device or a data consumption device. In various embodiments, a system for managing memory devices is disclosed where the real-time computing device stores, at the memory system, data generated by the real-time computing device or a data generation device. A controller of the system for managing memory devices may detect an operation that makes a memory system unavailable to the real-time computing device (e.g., a data consumer or a data producer). Further, the controller may detect that an amount of time corresponding to the operation exceeds an amount of time corresponding to a storage threshold of a local buffer of the real-time computing device. The controller may override the storage threshold prior to performing the operation by modifying the storage threshold and by overriding a default priority for access requests from the real-time computing device to the memory system. In other embodiments, the controller may not override the default priority. The real-time computing device may satisfy the modified storage threshold. As a result, the operation may be performed without causing the local buffer of the real-time computing device to overflow or underflow. Accordingly, in some cases, the operation may be performed without causing the real-time computing device to fail.

Figure 1:
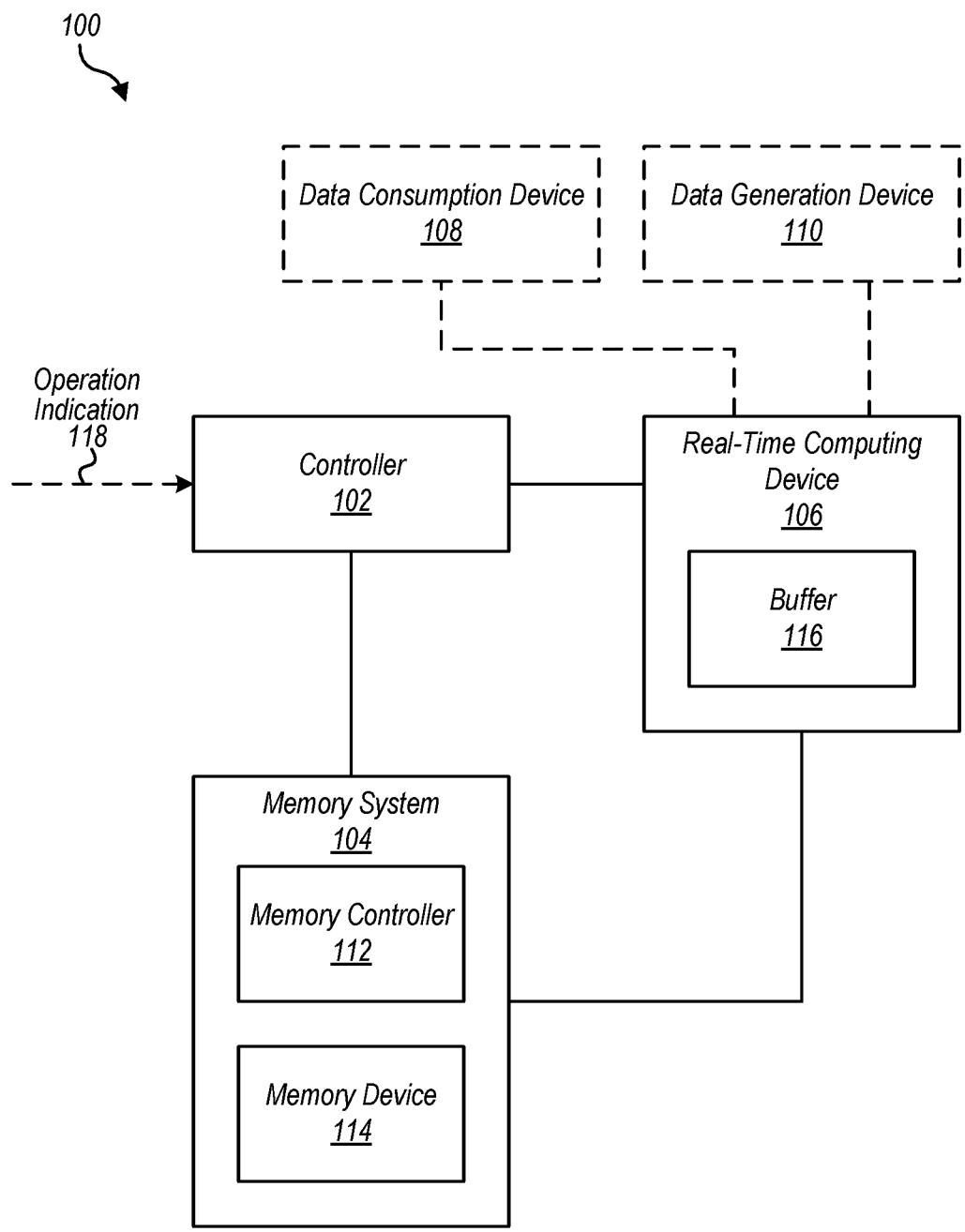
FIG. 1 is a block diagram illustrating one embodiment of an exemplary system for managing memory devices.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "local buffer configured to store data" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f)

during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a memory device that includes six memory locations, the terms "first memory location" and "second memory location" can be used to refer to any two of the six memory locations, and not, for example, just logical memory locations 0 and 1.

When used in the claims, the term "or" is used as an inclusive or and not as an exclusive or. For example, the phrase "at least one of x, y, or z" means any one of x, y, and z, as well as any combination thereof (e.g., x and y, but not z).

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION

A system for managing memory devices is described herein including a memory system, a computing device, and a controller. The computing device may retrieve data from the memory system and store the data in a local buffer. Additionally or alternatively, the computing device may store data from the local buffer in the memory system. An amount of the data stored in the computing device may satisfy a storage threshold of the local buffer. The storage threshold of the local buffer may, in some cases, represent a latency tolerance of the computing device. In various embodiments, the computing device may be a real-time computing device. In some embodiments, a priority of access requests may be determined based on a difference between an amount of data stored by the local buffer and the storage threshold (e.g., an amount the storage threshold exceeds the amount of data or an amount the amount of data exceeds the storage threshold).

As described herein, "real-time" is an open-ended term used to refer to a variety of devices and situations. "Real-time" may refer to a device that performs operations at or as near to immediacy as permitted by device operating parameters. "Real-time" is used not as an expression of necessity, but as a description of general behavior of the device. In particular, "real-time" may refer to situations where intended operation of the device is based on a time constraint. The device failing to satisfy the time constraint may not, in some cases, result in failure of the device, but failure may be likely. As used herein, "real-time" is expressly intended to include "near real-time," as is known in the art.

The controller may detect that the memory system should perform a particular operation (e.g., a calibration operation). The particular operation may make the memory system unavailable to the computing device. Additionally, the controller may detect that an amount of time corresponding to the particular operation exceeds an amount of time corresponding to the storage threshold. In other words, in some embodiments, the controller may detect, based on an expected rate of usage of data (e.g., data consumption or generation) at the local buffer, that the particular operation may cause a failure (e.g., an overflow or an underflow) at the computing device.

The controller may override the storage threshold at the local buffer by modifying the storage threshold. As a result, an amount of data needed to satisfy the storage threshold may be modified. Further, in some embodiments, the controller may override a default priority for access requests from the computing device to the memory system, enabling the computing device to use more bandwidth of the memory system. In other embodiments, the default priority may not be overridden. Accordingly, in some embodiments, the controller may cause the local buffer of the computing device to store a different amount of data, where the different amount of data is sufficient for the particular operation to be performed without causing the failure at the computing device.

As used herein, a storage threshold is "satisfied" when conditions associated with the storage threshold are met. For example, a storage threshold that specifies a minimum amount of data that should be stored at a local buffer is satisfied when the local buffer stores an amount of data equaling or exceeding the storage threshold. As another example, a storage threshold that specifies a maximum amount of data that should be stored at a local buffer is satisfied when the local buffer stores an amount of data less than or equal to the storage threshold.

This disclosure initially describes, with reference to FIG. 1, various portions of various embodiments of a system for managing memory devices. Example processes performed by various embodiments of a system for managing memory devices are described with reference to FIG. 2. Example processes performed by various embodiments of a system for managing memory devices where a real-time computing device retrieves data from a memory system are described with reference to FIGS. 3 and 4. Example processes performed by various embodiments of a system for managing memory devices where a real-time computing device sends data to a memory system are described with reference to FIGS. 5 and 6. Finally, an exemplary computing system that includes a system for managing memory devices is described with reference to FIG. 7.

Turning now to FIG. 1, a block diagram of various embodiments of an exemplary system 100 for managing memory devices is shown. In the illustrated embodiment, system 100 includes controller 102, memory system 104, and real-time computing device 106. Memory system 104 includes memory controller 112 and memory device 114. Real-time computing device 106 includes buffer 116. Additionally, in some embodiments, system 100 further includes at least one of data consumption device 108, data generation device 110, or operation indication 118. In various embodiments, system 100 may include multiple instances of various components. For example, system 100 may include multiple real-time computing devices 106, where at least some of the multiple real-time computing devices 106 are configured to perform a different operation than others of the multiple real-time computing devices.

Memory system 104 may store data at various memory locations of memory device 114. Access to memory device 114 may be controlled by memory controller 112. As described below with reference to FIGS. 3 and 4, in some embodiments, memory device 114 stores data and periodically sends the data to real-time computing device 106 (e.g., data to be consumed by data consumption device 108). As described below with reference to FIGS. 5 and 6, in some embodiments, memory device 114 periodically receives data from real-time computing device 106 (e.g., data generated by data generation device 110).

Real-time computing device 106 may store data within buffer 116. In various embodiments, real-time computing device 106 may request data from memory system 104, filling buffer 116. Alternatively, in some embodiments, real-time computing device may request that memory system 104 store data from buffer 116, emptying buffer 116. As noted above, real-time computing device 106 may send access requests (e.g., read requests and/or write requests) to memory system 104 such that a storage threshold of buffer 116 is satisfied. The access requests may have a particular priority (e.g., a default priority). In view of the particular priority, a particular amount of bandwidth may be devoted to the access requests by memory system 104. The storage threshold may be based on a latency between real-time computing device 106 and memory system 104 and based on an expected rate of utilization of the data of buffer 116. Accordingly, in some cases, the storage threshold may represent an amount of data to be stored at buffer 116 after accessing memory system 104 such that data may be consumed at a particular rate. In other cases, the storage threshold may represent an amount of free space at buffer 116 such that data may be stored in buffer 116 at a particular rate.

As mentioned above, in various embodiments, real-time computing device 106 may communicate with data consumption device 108, data generation device 110, or both. Data consumption device 108 may consume data from buffer 116 at a particular rate. For example, data consumption device 108 may be a display configured to render a particular number of bits per second from buffer 116 on a screen. If buffer 116 is unable to provide data (e.g., because buffer 116 is empty), data consumption device 108 may experience a failure. Data generation device 110 may generate data and store the data in buffer 116 at a particular rate. For example, data generation device 110 may be an image sensor processor (ISP) configured to generate a particular number of bits per cycle and store the bits in buffer 116 (e.g., based on data received from one or more image sensors). If buffer 116 is unable to store the data, the data may be lost and data generation device 110 may experience a failure. In some embodiments, real-time computing device 106 may include or may be data consumption device 108. Similarly, in some embodiments, real-time computing device 106 may include or may be data generation device 110. In some cases, data consumption device 108 may generate data. Similarly, in some cases, data generation device 110 may consume data.

Controller 102 may control at least some interactions between memory system 104 and real-time computing device 106. In particular, controller 102 may detect (e.g., based on determinations performed at controller 102 or based on operation indication 118) that memory system 104 should perform a particular operation. Specific examples of particular operations will be discussed further below. Memory system 104 may be unavailable to service at least some requests real-time computing device 106 during the particular operation. Controller 102 may determine that an amount of time corresponding to an amount of data stored at buffer 116 is less than an amount of time corresponding to the operation. In some embodiments, controller 102 may determine that an amount of time corresponding to the operation exceeds an amount of time corresponding to the storage threshold. In other words, controller 102 may determine that memory system 104 may be unavailable for a longer amount of time than real-time computing device 106 can operate without failing. In some cases, controller 102 may override the storage threshold of buffer 116, causing real-time computing device 106 to adjust an amount of data stored in buffer 116 such that, in some cases, real-time computing device 106 may operate for longer without failing. In particular, controller 102 may modify the storage threshold of buffer 116. Additionally, in some embodiments, controller 102 may override a current priority for the access requests from real-time computing device 106 to memory system 104 such that additional bandwidth is devoted for communications between real-time computing device 106 and memory system 104. The new priority may be based on a difference between an amount of data stored at buffer 116 and the storage threshold. For example, the priority may be increased by a larger amount when a difference between the amount of data stored at buffer 116 and the storage threshold is 1024 bytes, as compared to when a difference between the amount of data stored at buffer 116 and the storage threshold is 256 bytes. In other embodiments, the current priority for the access requests may be used. In some embodiments, subsequent to an indication that the real-time computing device 106 meets the modified storage threshold, controller 102 may request performance of the particular operation (e.g., by indicating to memory system 104 that memory system 104 should perform the particular operation). In some cases, controller 102 may not modify the threshold and may postpone the operation until real-time computing device 106 can operate for the amount of time corresponding to the operation. For example, controller 102 may not modify the threshold in response to the amount of time corresponding to the threshold exceeding the amount of time corresponding to the operation but the amount of time corresponding to the operation exceeding the amount of time corresponding to the amount of data stored at buffer.

In some embodiments, real-time computing device 106 communicates, to controller 102, an indication of an amount of data stored in buffer 116. For example, real-time computing device 106 may communicate a number of bytes stored in buffer 116. Alternatively, real-time computing device 106 may communicate whether the storage threshold is satisfied. As another alternative, real-time computing device 106 may communicate a latency tolerance of buffer 116. In some embodiments, the latency tolerance may be an expected amount of time buffer 116 may be utilized without an access to memory system 104 before a failure due to a buffer underflow or a buffer overflow. In other embodiments, controller 102 requests the indication of the amount of data stored in buffer 116. In some embodiments, when real-time computing device 106 is inactive, real-time computing device 106 may indicate that it is inactive to controller 102 and controller 102 may ignore the amount of data stored in buffer 116. In other embodiments, when real-time computing device 106 is inactive, real-time computing device 106 may indicate a predetermined latency tolerance (e.g., a maximum latency tolerance of real-time computing device 106) to controller 102.

In some embodiments, controller 102 may modify the storage threshold by a different amount based on the particular operation. For example, the storage threshold may be modified by a larger amount for an operation that is expected to make memory system 104 unavailable to real-time computing device 106 for a larger amount of time.

The particular operation may take various forms. Several example operations are described herein. In various embodiments, the particular operation may be a calibration operation. For example, memory device 114 may require periodic calibration. Memory device 114 may be unable to service at least some requests from real-time computing device 106 during the calibration and thus may be unavailable to real-time computing device 106. As another example, memory device 114 may be a dynamic random access memory (DRAM) device that needs to periodically enter a self-refresh mode, where memory device 114 is unable to service at least some requests from real-time computing device 106 during the self-refresh mode. As another example, the particular operation may be a power gating operation at memory controller 112 (e.g., when memory device 114 is in a sleep mode). Other examples of the particular operation may include: a frequency change at memory system 104, a voltage change at memory system 104, and disabling some or all of a fabric that connects memory system 104 to real-time computing device 106. As another example, a central processing unit (CPU) may perform a cache flush and demand priority from memory system 104 until the cache is restored. As a result, although memory device 114 may be available to the CPU, memory device may be unavailable to real-time computing device 106. In some cases, memory device 114 may be able to service at least some requests from real-time computing device 106 but unable to service enough requests from real-time computing device 106 to prevent a failure at real-time computing device 106. This is not intended to be an exhaustive list of operations. Any operation that makes memory system 104 unavailable to real-time computing device 106 is contemplated.

As noted above, in some embodiments, as a result of overriding the storage threshold, real-time computing device 106 can operate for a longer amount of time without accessing memory system 104 and without failing. In some cases, a system including system 100 may make memory system 104 unavailable to a real-time computing device longer, as compared to a system that does not override a storage threshold. Accordingly, various operations may be performed in a different manner. For example, the particular operation may involve a frequency change as part of a calibration of memory device 114. A phase locked loop (PLL) may be provided a sufficient amount of time to relock at a frequency of memory device 114, as opposed to running at a least common multiple of a frequency of memory device 114 and frequencies of various other devices (e.g., including real-time computing device 106). In some cases, running the PLL at the frequency of memory device 114 may cause the calibration to be performed more quickly and may reduce power consumption of the PLL.

Figure 2:
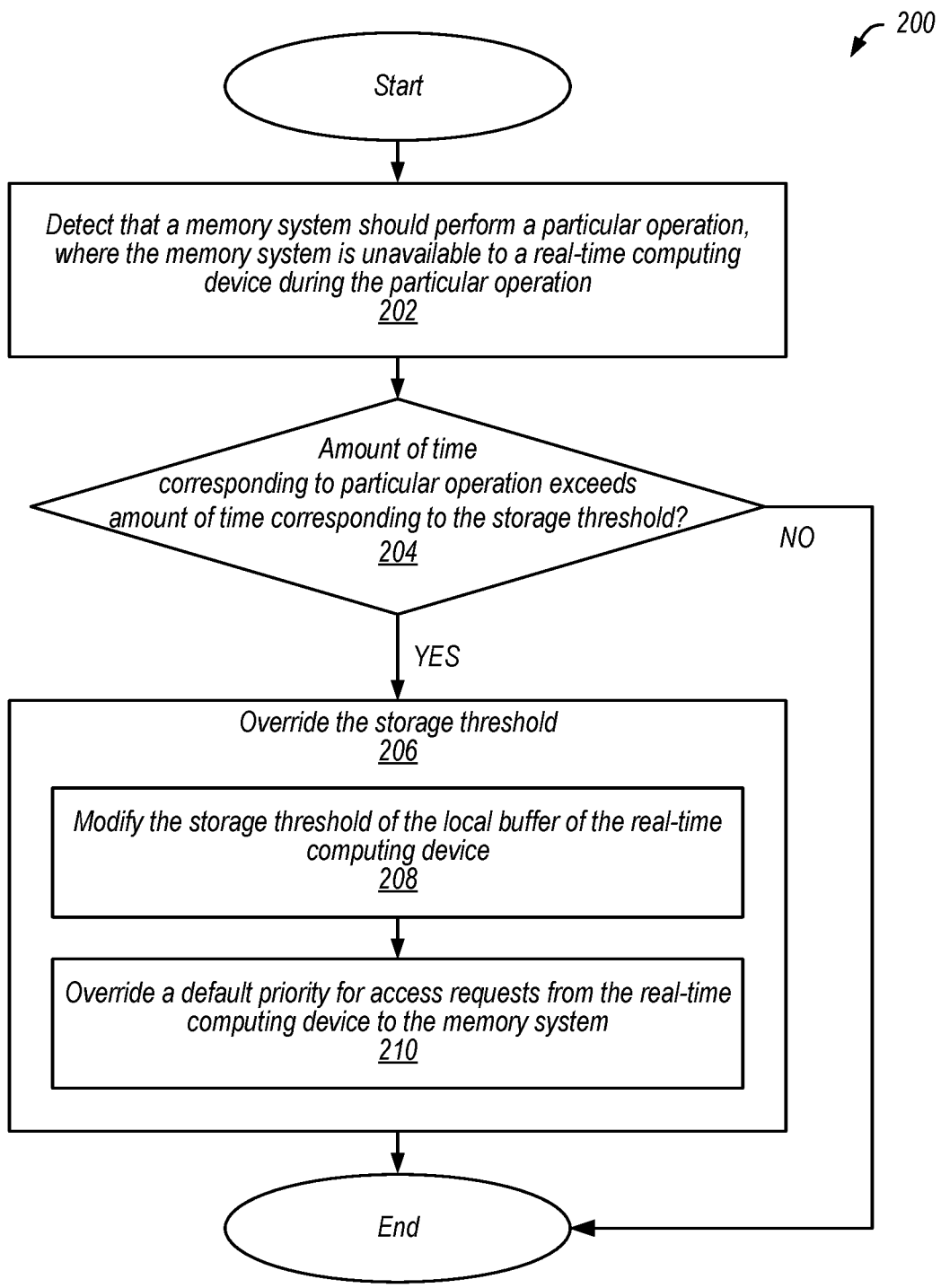
FIG. 2 is a flow diagram illustrating one embodiment of a method of controlling a real-time computing device of a system for managing memory devices.

Referring now to FIG. 2, a flow diagram of a method 200 is depicted. Method 200 is an embodiment of a method of controlling a real-time computing device of a system. In some embodiments, method 200 may be initiated or performed by one or more processors in response to one or more instructions stored by a computer-readable storage medium.

At 202, method 200 includes detecting that a memory system should perform a particular operation, where the memory system is unavailable to a real-time computing device during the particular operation. For example, method 200 may include controller 102 of FIG. 1 detecting that memory system 104 should perform a particular operation that makes memory system 104 unavailable to real-time computing device 106.

At 204, method 200 includes determining whether an amount of time corresponding to the particular operation exceeds an amount of time corresponding to a storage threshold of the real-time computing device. For example, method 200 may include controller 102 determining whether an amount of time corresponding to the particular operation exceeds an amount of time corresponding to a storage threshold of buffer 116. The storage threshold may be based on a latency of the memory system and an expected rate of utilization of the data of the local buffer. In response to the amount of time corresponding to the particular operation not exceeding the amount of time corresponding to the threshold of the real-time computing device, method 200 ends.

In response to determining that the amount of time corresponding to the particular operation exceeds the amount of time corresponding to the threshold of the computing device, at 206, method 200 includes overriding the storage threshold. In the illustrated embodiment, overriding the storage threshold includes, at 208, modifying the storage threshold of the local buffer of the real-time computing device. For example, controller 102 may modify (e.g., increase or decrease) the storage threshold of buffer 116. In the illustrated embodiment, overriding the storage threshold further includes, at 210, overriding a default priority for access requests from the real-time computing device to the memory system. For example, controller 102 may contact real-time computing device 106, memory system 104, or both to increase a priority for access requests from real-time computing device 106 to memory system 104. As noted above, in other embodiments, the default priority may be used for the access requests. Accordingly, a method of controlling a real-time computing device of a system is depicted.

Figure 3:
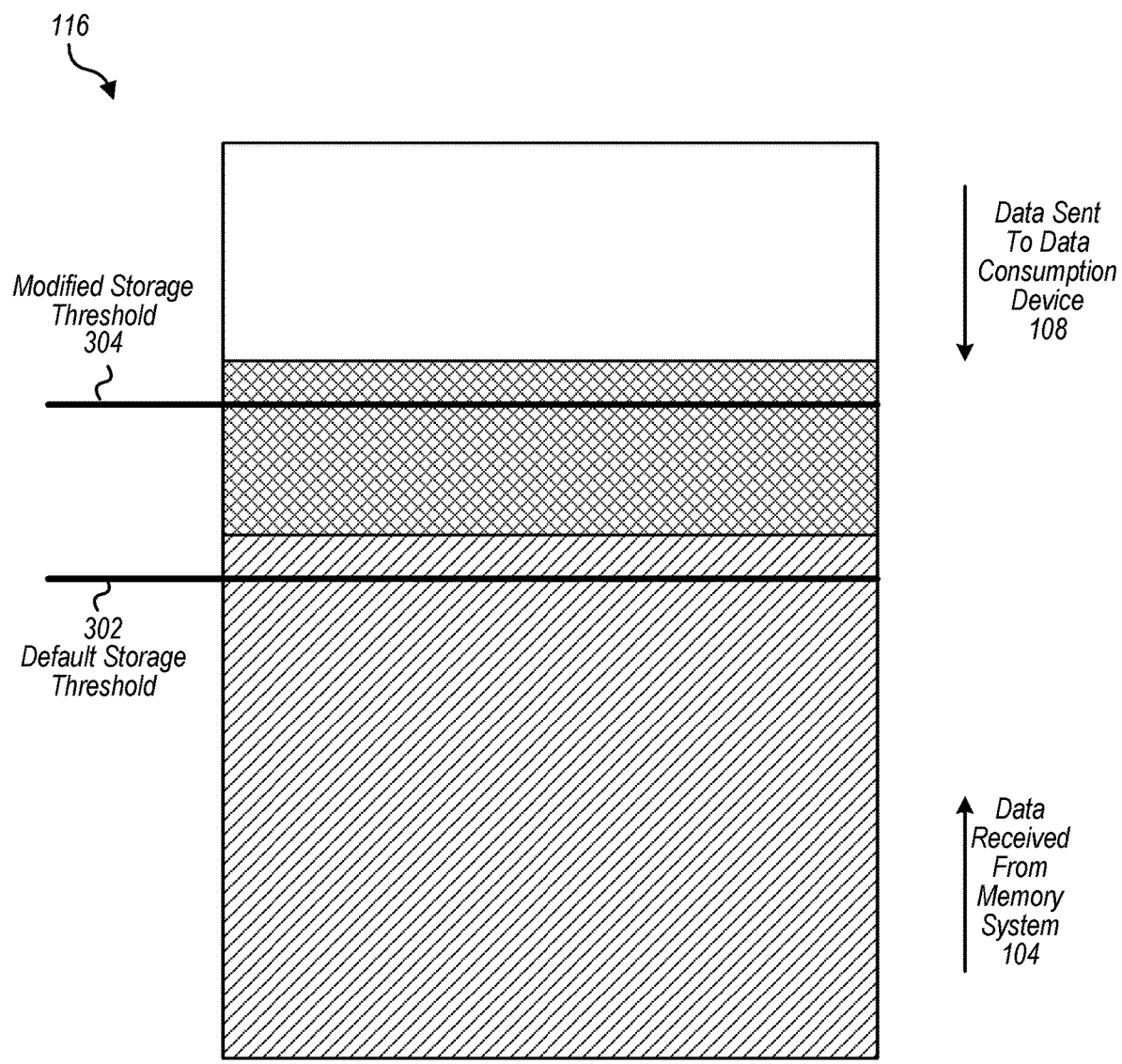
FIG. 3 is a block diagram illustrating an exemplary buffer of one embodiment of a real-time computing device.
Figure 4:
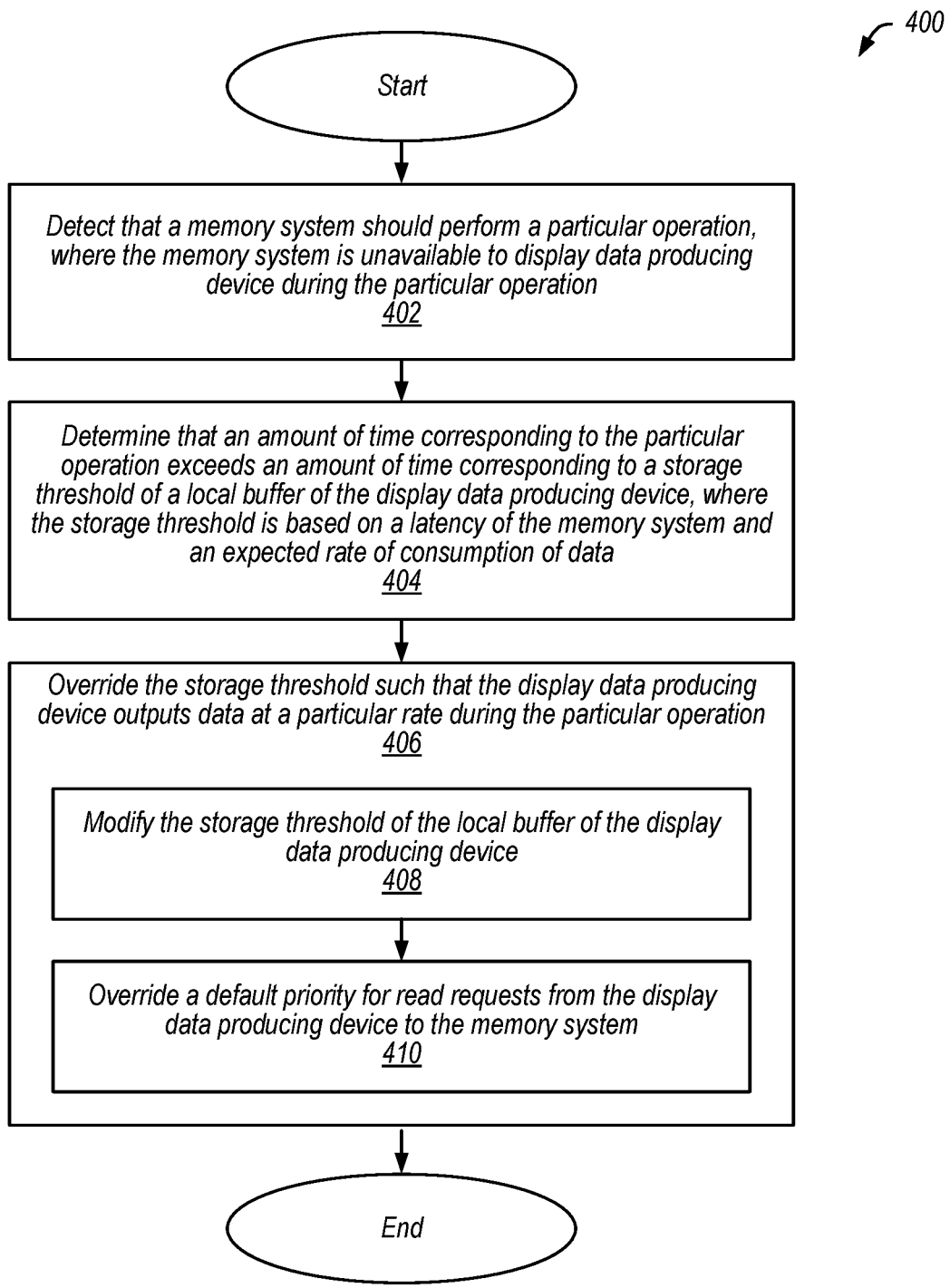
FIG. 4 is a flow diagram illustrating one embodiment of a method of preventing an underflow at display data producing device of a system for managing memory devices.

As noted above, in some embodiments, real-time computing device 106 may retrieve data from memory system 104 and store the data in buffer 116. The data may be consumed as part of a data consumption process (e.g., using data consumption device 108). In some embodiments, real-time computing device 106 may store data from buffer 116 in memory system 104. The data may be generated and stored in buffer 116 as part of a data generation process (e.g., using data generation device 110). FIGS. 3 and 4 describe various embodiments of system 100 where data is retrieved from memory system 104 and stored in buffer 116.

Turning now to FIG. 3, a block diagram illustrating an exemplary buffer 116 of one embodiment of a real-time computing device 106 is shown. In the illustrated embodiment, buffer 116 includes default storage threshold 302 and modified storage threshold 304.

In the illustrated embodiment, data is sent from buffer 116 to data consumption device 108 at a particular rate. When the data is sent to data consumption device 108, the data may be deleted from buffer 116. As further discussed below with reference to FIG. 4, in the illustrated embodiment, real-time computing device 106 is a display data producing device and data consumption device 108 is a display. In some embodiments, if data cannot be sent to data consumption device 108 (e.g., because buffer 116 is empty), real-time computing device 106, data consumption device 108, or both may fail.

Prior to default storage threshold 302 being modified, data may be received from memory system 104 such that default storage threshold 302 is satisfied. In other words, real-time computing device 106 may periodically send read requests to memory system 104, requesting an amount of data such that the data, at least periodically, equals or exceeds default storage threshold 302. Default storage threshold 302 may be based on a latency between real-time computing device 106 and memory system 104. Additionally, default storage threshold 302 may be based on an expected rate of utilization of the data of buffer 116 (e.g., by data consumption device 108). The read requests may have a default priority.

In response to determining that an amount of time corresponding to a particular operation exceeds an amount of time corresponding to default storage threshold 302, controller 102 may increase the storage threshold to modified storage threshold 304. Subsequently, data may be received from memory system 104 such that modified storage threshold 304 is satisfied. The read requests may have a higher priority than the default priority such that additional bandwidth is devoted to the read requests by memory system 104, real-time computing device 106, or both. In some embodiments, when modified storage threshold 304 is satisfied, data consumption device 108 may take longer to deplete the data, as compared to when default storage threshold 302 is satisfied. Accordingly, a failure may be prevented during performance of the particular operation.

Referring now to FIG. 4, a flow diagram of a method 400 is depicted. Method 400 is an embodiment of a method of preventing an underflow at a display data producing device of a system. In some embodiments, method 400 may be initiated or performed by one or more processors in response to one or more instructions stored by a computer-readable storage medium.

At 402, method 400 includes detecting that a memory system should perform a particular operation, where the memory system is unavailable to a display data producing device during the particular operation. For example, method 400 may include controller 102 of FIG. 1 detecting that memory system 104 should perform a particular operation that makes memory system 104 unavailable to real-time computing device 106.

At 404, method 400 includes determining that an amount of time corresponding to the particular operation exceeds an amount of time corresponding to a storage threshold of the display data producing device. The storage threshold may be based on a latency of the memory system and an expected rate of consumption of the data. For example, method 400 may include controller 102 determining that an amount of time corresponding to the particular operation exceeds an amount of time corresponding to default storage threshold 302 of buffer 116.

In response to determining that the amount of time corresponding to the particular operation exceeds the amount of time corresponding to the threshold of the computing device, at 406, method 400 includes overriding the storage threshold such that the display data producing device outputs data at a particular rate during the particular operation. In the illustrated embodiment, overriding the storage threshold includes, at 408, modifying the storage threshold of the local buffer of the display data producing device. For example, controller 102 may increase the storage threshold of buffer 116 from default storage threshold 302 to modified storage threshold 304. In the illustrated embodiment, overriding the storage threshold further includes, at 410, overriding a default priority for read requests from the display data producing device to the memory system. For example, controller 102 may contact real-time computing device 106, memory system 104, or both to increase a priority for read requests from real-time computing device 106 to memory system 104. Accordingly, a method of preventing an underflow at display data producing device of a system is depicted.

Figure 5:
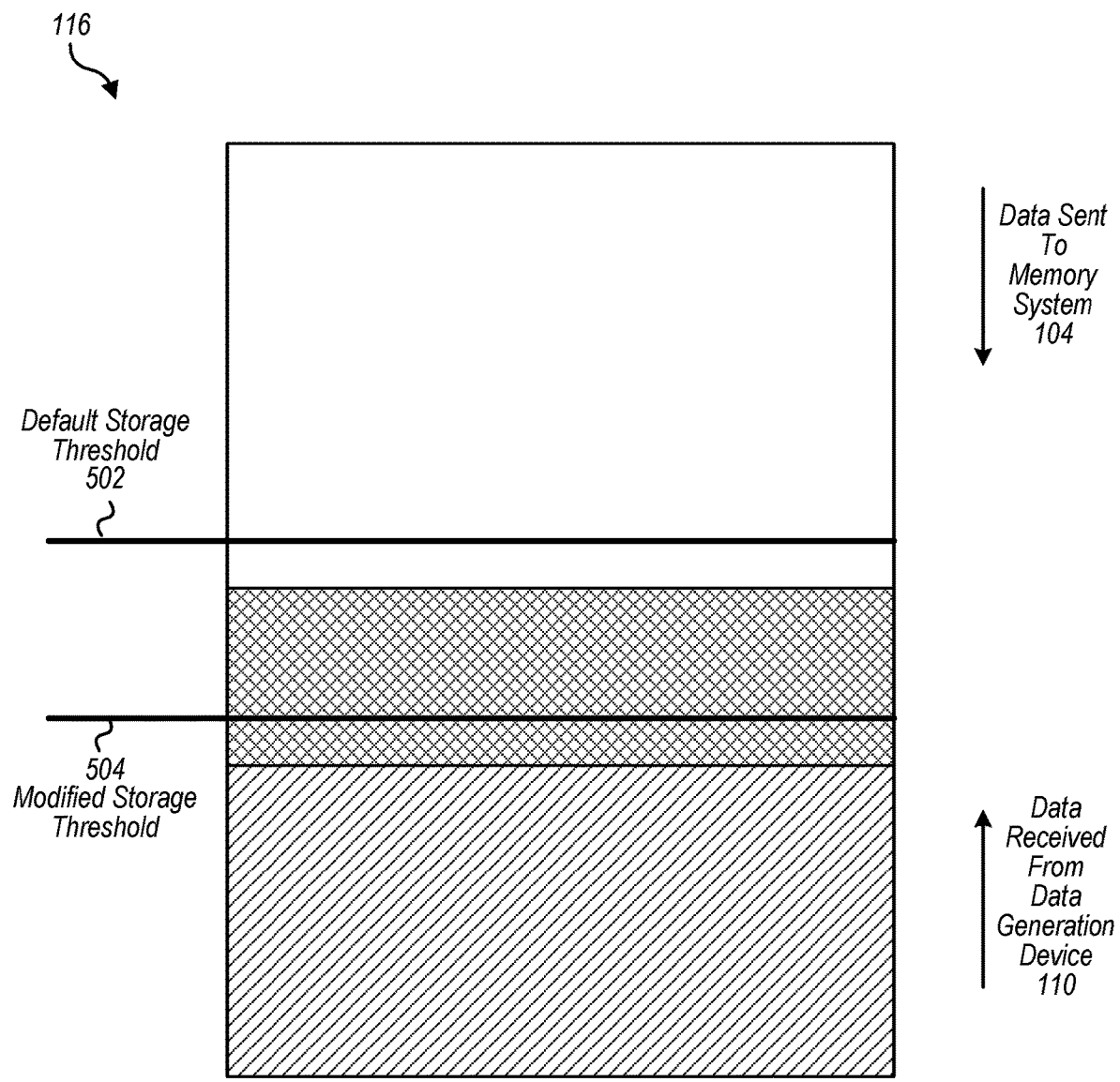
FIG. 5 is a block diagram illustrating an exemplary buffer of one embodiment of a real-time computing device.
Figure 6:
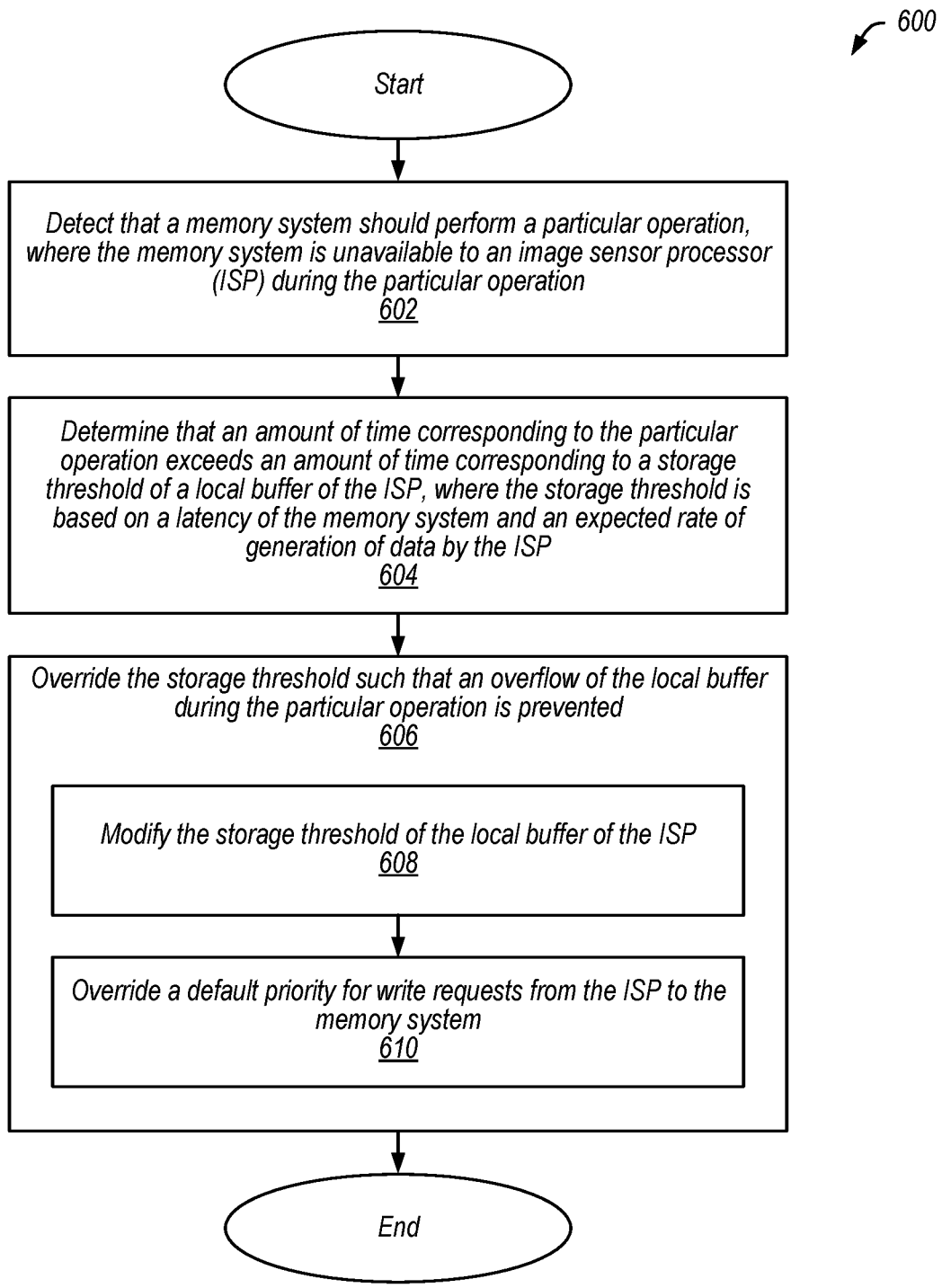
FIG. 6 is a flow diagram illustrating one embodiment of a method of preventing an overflow at an instruction set processor of a system for managing memory devices.

As noted above, in some embodiments, real-time computing device 106 may retrieve data from memory system 104 and store the data in buffer 116. The data may be consumed as part of a data consumption process (e.g., using data consumption device 108). In some embodiments, real-time computing device 106 may store data from buffer 116 in memory system 104. The data may be generated and stored in buffer 116 as part of a data generation process (e.g., using data generation device 110). FIGS. 5 and 6 describe various embodiments of system 100 where data is stored from buffer 116 to memory system 104.

Turning now to FIG. 5, a block diagram illustrating an exemplary buffer 116 of one embodiment of a real-time computing device 106 is shown. In the illustrated embodiment, buffer 116 includes default storage threshold 502 and modified storage threshold 504.

In the illustrated embodiment, data is received at buffer 116 from data generation device 110 at a particular rate. As further discussed below with reference to FIG. 6, in some embodiments, real-time computing device 106 includes data generation device 110 and data generation device 110 is an instruction set processor. In some embodiments, if buffer 116 cannot store data from data generation device 110 (e.g., because buffer 116 is full), real-time computing device 106, data generation device 110, or both may fail.

Prior to default storage threshold 502 being modified, data may be sent to memory system 104 and deleted from buffer 116 such that default storage threshold 502 is satisfied. In other words, real-time computing device 106 may periodically send write requests to memory system 104, requesting storage of an amount of data such that the data at buffer 116, at least periodically, is less than or equal to default storage threshold 502. Default storage threshold 502 may be based on a latency between real-time computing device 106 and memory system 104. Additionally, default storage threshold 502 may be based on an expected rate of generation of the data (e.g., by data generation device 110). The write requests may have a default priority.

In response to determining that an amount of time corresponding to a particular operation exceeds an amount of time corresponding to default storage threshold 502, controller 102 may decrease the storage threshold to modified storage threshold 504. Subsequently, data may be sent to memory system 104 such that modified storage threshold 504 is satisfied. The write requests may have a higher priority than the default priority such that additional bandwidth is devoted to the write requests by memory system 104, real-time computing device 106, or both. In some embodiments, when modified storage threshold 504 is satisfied, data generation device 110 may take longer to fill buffer 116, as compared to when default storage threshold 502 is satisfied. Accordingly, a failure may be prevented during performance of the particular operation.

Referring now to FIG. 6, a flow diagram of a method 600 is depicted. Method 600 is an embodiment of a method of preventing an overflow at an image sensor processor (ISP) of a system. In some embodiments, method 600 may be initiated or performed by one or more processors in response to one or more instructions stored by a computer-readable storage medium. Further, in some embodiments an ISP may be any processor or processors configured to process image data captured by an imaging device, such as a camera.

At 602, method 600 includes detecting that a memory system should perform a particular operation, where the memory system is unavailable to an ISP during the particular operation. For example, method 600 may include controller 102 of FIG. 1 detecting that memory system 104 should perform a particular operation that makes memory system 104 unavailable to real-time computing device 106.

At 604, method 600 includes determining that an amount of time corresponding to the particular operation exceeds an amount of time corresponding to a storage threshold of the ISP. The storage threshold may be based on a latency of the memory system and an expected rate of generation of the data by the ISP. For example, method 600 may include controller 102 determining that an amount of time corresponding to the particular operation exceeds an amount of time corresponding to default storage threshold 502 of buffer 116.

In response to determining that the amount of time corresponding to the particular operation exceeds the amount of time corresponding to the threshold of the computing device, at 606, method 600 includes overriding the storage threshold such that an overflow of the local buffer during the particular operation is prevented. In the illustrated embodiment, overriding the storage threshold includes, at 608, modifying the storage threshold of the local buffer of the ISP. For example, controller 102 may decrease the storage threshold of buffer 116 from default storage threshold 502 to modified storage threshold 504. In the illustrated embodiment, overriding the storage threshold further includes, at 610, overriding a default priority for write requests from the ISP to the memory system. For example, controller 102 may contact real-time computing device 106, memory system 104, or both to increase a priority for write requests from real-time computing device 106 to memory system 104. As noted above, in other embodiments, the default priority may be used for the write requests. Accordingly, a method of preventing an overflow at an ISP of a system is depicted.

Figure 7:
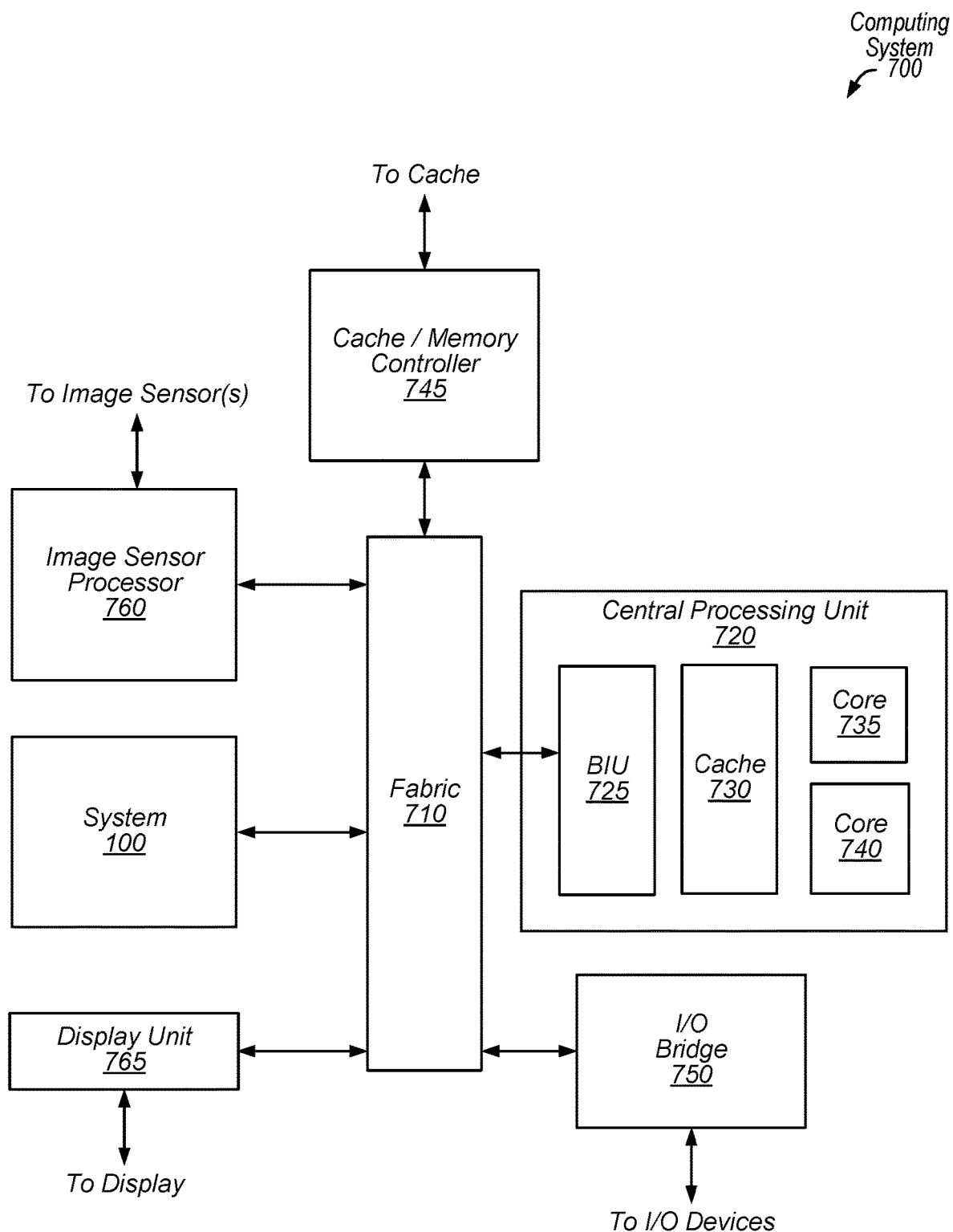
FIG. 7 is block diagram illustrating an embodiment of an exemplary computing system that includes at least a portion of an exemplary system for managing memory devices.

Turning next to FIG. 7, a block diagram illustrating an exemplary embodiment of a computing system 700 that includes at least a portion of an exemplary system for managing memory devices. Computing system 700 may include various circuits described above with reference to FIGS. 1-6. Computing system 700 may further include any variations or modifications described previously with reference to FIGS. 1-6. In some embodiments, some or all elements of the computing system 700 may be included within a system on a chip (SoC). In some embodiments, computing system 700 is included in a mobile device. Accordingly, in at least some embodiments, area, timing, and power consumption of computing system 700 may be important design considerations. In the illustrated embodiment, computing system 700 includes fabric 710, central processing unit (CPU) 720, input/output (I/O) bridge 750, cache/memory controller 745, image sensor processor (ISP) 760, display unit 765, and system 100. Although computing system 700 illustrates only a single instance of system 100, in other embodiments, system 100 may be located elsewhere (e.g., connected to cache/memory controller 745, within central processing unit 720, or within display unit 765) or in multiple locations. Although computing system 700 illustrates central processing unit 720 as being connected to fabric 710 as a sole central processing unit of the computing system 700, in other embodiments, central processing unit 720 may be connected to or included in other components of the computing system 700 and other central processing units may be present. Additionally or alternatively, the computing system 700 may include multiple instances of various components, such as CPU 720 or ISP 760. The multiple components may correspond to different embodiments or to the same embodiment.

Fabric 710 may include various interconnects, buses, MUXes, controllers, etc., and may be configured to facilitate communication between various elements of computing system 700. In some embodiments, portions of fabric 710 are configured to implement various different communication protocols. In other embodiments, fabric 710 implements a single communication protocol and elements coupled to fabric 710 may convert from the single communication protocol to other communication protocols internally.

In the illustrated embodiment, central processing unit 720 includes bus interface unit (BIU) 725, cache 730, and cores 735 and 740. In various embodiments, central processing unit 720 includes various numbers of cores and/or caches. For example, central processing unit 720 may include 1, 2, or 4 processor cores, or any other suitable number. In some embodiments, cores 735 and/or 740 include internal instruction and/or data caches. In some embodiments, a coherency unit (not shown) in fabric 710, cache 730, or elsewhere in computing system 700 is configured to maintain coherency between various caches of computing system 700. BIU 725 may be configured to manage communication between central processing unit 720 and other elements of computing system 700. Processor cores 735 and 740 may be configured to execute instructions of a particular instruction set architecture (ISA), which may include operating system instructions and user application instructions. In some embodiments, central processing unit 720 includes or is included in system 100. For example, in some embodiments, cache 730 may correspond to memory device 114.

Cache/memory controller 745 may be configured to manage transfer of data between fabric 710 and one or more caches and/or memories (e.g., non-transitory computer readable mediums). For example, cache/memory controller 745 may be coupled to an L3 cache, which may, in turn, be coupled to a system memory. In other embodiments, cache/memory controller 745 is directly coupled to a memory. In some embodiments, the cache/memory controller 745 includes one or more internal caches. In some embodiments, the cache/memory controller 745 may include or be coupled to one or more caches and/or memories that include instructions that, when executed by one or more processors, cause the processor, processors, or cores to initiate or perform some or all of the processes described above with reference to FIGS. 1-6. In some embodiments, cache/memory controller 745 may include or may be included in system 100.

As used herein, the term "coupled to" may indicate one or more connections between elements, and a coupling may include intervening elements. For example, in FIG. 7, display unit 765 may be described as "coupled to" central processing unit 720 through fabric 710. In contrast, in the illustrated embodiment of FIG. 7, display unit 765 is "directly coupled" to fabric 710 because there are no intervening elements.

Image sensor processor (ISP) 760 may include dedicated hardware that may facilitate the performance of various stages of an image processing pipeline. In the illustrated embodiment, ISP 760 may be configured to receive image data from image sensor(s), and to process the data into a form that is usable by other components of computing system 700. Image data may pass from the image sensor(s), through ISP 760 to a system memory (e.g., memory system 104 of FIG. 1) or to another functional component (e.g., display unit 765 or CPU 720). In some embodiments, ISP 760 may be configured to perform various image-manipulation operations such as image translation operations, horizontal and vertical scaling, color space conversion or other non-warping image editing operations, and/or image stabilization transformations. In this example, image sensor(s) may be any type of image sensor suitable for capturing image data (e.g., an image sensor that is responsive to captured light), such as an active-pixel sensor (e.g., complementary metal-oxide-semiconductor (CMOS) active-pixel sensor) or charge-coupled device (CCD) photosensor on a camera, video camera, or other device that includes a camera or video camera. In various embodiments, data generation device 110 of FIG. 1 may include ISP 760, image sensor(s), or both.

Display unit 765 may be configured to read data from a frame buffer and provide a stream of pixel values for display. Display unit 765 may be configured as a display pipeline in some embodiments. Additionally, display unit 765 may be configured to blend multiple frames to produce an output frame. Further, display unit 765 may include one or more interfaces (e.g., MIPI® or embedded display port (eDP)) for coupling to a user display (e.g., a touchscreen or an external display). In some embodiments, display unit 765 may include or may be included in system 100.

I/O bridge 750 may include various elements configured to implement: universal serial bus (USB) communications, security, audio, and/or low-power always-on functionality, for example. I/O bridge 750 may also include interfaces such as pulse-width modulation (PWM), general-purpose input/output (GPIO), serial peripheral interface (SPI), and/or inter-integrated circuit (I2C), for example. Various types of peripherals and devices may be coupled to computing system 700 via I/O bridge 750. In some embodiments, central processing unit 720 may be coupled to computing system 700 via I/O bridge 750.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a phase-locked loop (PLL) circuit configured to generate a signal having a first frequency;
a memory system configured to receive the signal supplied by the PLL circuit in order to operate at a second, different frequency;
a computing device coupled to the PLL and configured to store data within a local buffer having a corresponding storage threshold, wherein the data satisfies the storage threshold at a time, and wherein the storage threshold is based on a latency of an operation between the local buffer and the memory system and an expected rate of utilization of the data of the local buffer; and
a controller configured to:
detect, subsequent to the time, that the memory system is to perform a particular operation that makes the memory system unavailable to the computing device during the particular operation, wherein the particular operation includes a calibration of the memory system;
detect that an amount of time corresponding to the particular operation exceeds an amount of time corresponding to the storage threshold; and
in response to detecting that the amount of time corresponding to the particular operation exceeds the amount of time corresponding to the storage threshold, override the storage threshold by modifying the storage threshold of the local buffer of the computing device;
wherein, during the particular operation, the PLL circuit is configured to relock from the first frequency to the second frequency to perform the calibration.

2. The apparatus of claim 1, wherein the controller is further configured to, subsequent to detecting that the modified storage threshold is satisfied, indicate to the memory system that the memory system is to perform the particular operation.

3. The apparatus of claim 1, further comprising a data consumption device configured to consume data from the computing device, wherein the expected rate of utilization of the data of the local buffer corresponds to an expected rate of consumption of the data by the data consumption device.

4. The apparatus of claim 1, wherein access requests include one or more read requests from the computing device to the memory system.

5. The apparatus of claim 1, further comprising a data generation device configured to generate data and store the data in the local buffer of the computing device, wherein the expected rate of utilization of the data of the local buffer corresponds to an expected rate of data generation by the data generation device.

6. The apparatus of claim 5, wherein the computing device includes the data generation device.

7. The apparatus of claim 1, wherein the access requests include one or more write requests from the computing device to the memory system.

8. The apparatus of claim 1, wherein the computing device is configured to communicate, to the controller, a latency tolerance, wherein the latency tolerance is based on the expected rate of utilization and an amount of data stored in the local buffer.

9. The apparatus of claim 1, wherein the controller is further configured, subsequent to the computing device satisfying the modified storage threshold, to revert the modified storage threshold to a default value.

10. The apparatus of claim 1, wherein the controller is further configured to:
   detect that the memory system is to perform a different operation that makes the memory system unavailable to the computing device;
   detect that a different amount of time corresponding to the different operation exceeds the amount of time corresponding to the storage threshold; and
   in response to detecting that the amount of time corresponding to the different operation exceeds the amount of time corresponding to the storage threshold, override the storage threshold by:
   modifying the storage threshold of the local buffer of the computing device, wherein the modified storage threshold for the particular operation is different from the modified storage threshold for the different operation.

11. The apparatus of claim 1, wherein the controller is further configured, subsequent to the computing device satisfying the modified storage threshold, to revert a priority for access requests to a default priority.

12. The apparatus of claim 1, wherein the computing device is one of a plurality of computing devices coupled to the controller, and wherein the first frequency of the PLL circuit is a least common multiple of a frequency of the memory system and frequencies of the plurality of computing devices.

13. The apparatus of claim 1, wherein the controller is further configured to, during the particular operation, override a default priority for access requests of the computing device to the memory system.

14. A system, comprising:
   a phase-locked loop (PLL) configured to generate a signal having a first frequency;
   a computing system coupled to the PLL, the computing system comprising:
      a memory system configured to store data, wherein the memory system is coupled to receive the signal supplied by the PLL in order to operate at a second, different frequency;
      a plurality of computing devices, wherein at least one of the plurality of computing devices is;
      a display data producing device configured to:
         store at least a portion of the data from the memory system within a local buffer, wherein the at least a portion of the data satisfies a storage threshold, at a time, of the local buffer; and
         provide the data from the local buffer to the at least one of the plurality of computing devices at a particular rate, wherein the storage threshold is based on a latency of an operation between the local buffer and the memory system and the particular rate; and
      a controller coupled to the plurality of computing devices, wherein the controller is configured to:
         detect, subsequent to the time, that the memory system is to perform a particular operation that makes the memory system unavailable to the display data producing device, the particular operation including a frequency change and a calibration of the memory system;
         determine that an amount of time corresponding to the particular operation exceeds an amount of time corresponding to the storage threshold; and
         in response to determining that the amount of time corresponding to the particular operation exceeds the amount of time corresponding to the storage threshold, override the storage threshold such that the display data producing device outputs data at the particular rate during the particular operation by:
         modifying the storage threshold of the local buffer of the display data producing device;
      wherein, during the particular operation, the PLL is configured to relock from the first frequency to the second frequency to perform the calibration, wherein the first frequency of the PLL is a least common multiple of the memory system and a plurality of computing devices coupled to the controller.

15. The system of claim 14, wherein the particular operation includes performing a voltage change at the memory system.

16. The system of claim 14, wherein the controller is configured to override a default priority for access requests of the display data producing device to the memory system.

17. A method, comprising:
   generating, using a phase-locked loop (PLL), a signal having a first frequency;
   receiving, at a memory system, the signal supplied by the PLL in order to operate at a second, lower frequency;
   detecting that the memory system is to perform a particular operation that makes the memory system unavailable to a computing device, wherein the particular operation includes a calibration of the memory system;
   determining that an amount of time corresponding to the particular operation exceeds an amount of time corresponding to a storage threshold of a local buffer of the computing device, wherein the storage threshold is based on a latency of an operation between the local buffer and the memory system and an expected rate of generation of data by the computing device; and
   in response to determining that the amount of time corresponding to the particular operation exceeds the amount of time corresponding to the storage threshold, preventing an overflow of the local buffer during the particular operation by:
   modifying the storage threshold of the local buffer of the computing device; and
   relocking the PLL from the first frequency to the second frequency to perform the calibration.

18. The method of claim 17, wherein the computing device is one of a plurality of computing devices coupled to the PLL, and wherein the first frequency is a least common multiple of a frequency of the memory system and frequencies of the plurality of computing devices.

19. The method of claim 17, further comprising overriding a default priority for access requests of the computing device to the memory system.

20. The method of claim 17, further comprising communicating, to a controller, a latency tolerance, wherein the latency tolerance is based on the expected rate of generation and an amount of data stored in the local buffer.

* * * * *